(12) United States Patent
Oshio (10) Patent No.: US 7,242,032 B2
(45) Date of Patent: *Jul. 10, 2007

(54) LIGHT EMITTING DEVICE

(75) Inventor: Hiroaki Oshio, Kitakyushu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/119,524

(22) Filed: Apr. 9, 2002

(65) Prior Publication Data

US 2002/0185649 A1   Dec. 12, 2002

(30) Foreign Application Priority Data

Apr. 9, 2001 (JP) ............................. 2001-110674

(51) Int. Cl.
   *H01L 33/00* (2006.01)
(52) U.S. Cl. ..................... 257/99; 257/81; 257/98; 257/100
(58) Field of Classification Search ............ 257/81, 257/89, 99, 666, 787, 676, 684, 788, 793
See application file for complete search history.

(56) References Cited

U.S. PATENT DOCUMENTS

| | | | | |
|---|---|---|---|---|
| 4,160,308 A | * | 7/1979 | Courtney et al. ............. 438/25 |
| 4,933,729 A | * | 6/1990 | Soejima et al. ............... 257/82 |
| 5,489,800 A | * | 2/1996 | Brown et al. ................ 257/666 |
| 5,763,901 A | * | 6/1998 | Komoto et al. ............... 257/99 |
| RE36,446 E | * | 12/1999 | Lumbard et al. ............. 438/27 |
| 5,998,925 A | | 12/1999 | Shimizu et al. | |
| RE36,614 E | | 3/2000 | Lumbard et al. | |
| 6,091,139 A | * | 7/2000 | Adachi et al. ............... 257/690 |
| 6,147,367 A | * | 11/2000 | Yang et al. .................... 257/88 |
| 6,274,890 B1 | * | 8/2001 | Oshio et al. .................. 257/98 |
| 6,340,824 B1 | * | 1/2002 | Komoto et al. ............... 257/99 |
| 6,597,019 B2 | * | 7/2003 | Inoue et al. ................... 257/99 |
| 6,747,293 B2 | * | 6/2004 | Nitta et al. .................... 257/99 |
| 2001/0024087 A1 | * | 9/2001 | Suehiro et al. ............. 313/512 |
| 2002/0158257 A1 | * | 10/2002 | Nei ............................ 257/79 |
| 2004/0217369 A1 | * | 11/2004 | Nitta et al. .................... 257/99 |

FOREIGN PATENT DOCUMENTS

| | | |
|---|---|---|
| JP | 57-162670 | 12/1976 |
| JP | 54-29653 | 2/1979 |
| JP | 11-54804 | 2/1989 |
| JP | 01-146376 | 6/1989 |
| JP | 10-256610 | 9/1998 |
| JP | 10-261821 | * 9/1998 |

OTHER PUBLICATIONS

U.S. Appl. No. 10/119,413, filed Apr. 9, 2002, Shimomura.
U.S. Appl. No. 10/118,612, filed Apr. 8, 2002, Nitta et al.
U.S. Appl. No. 10/118,604, filed Apr. 8, 2002, Nitta et al.
U.S. Appl. No. 10/795,839, filed Mar. 8, 2002, Nitta et al.

* cited by examiner

*Primary Examiner*—Evan Pert
*Assistant Examiner*—Fazli Erdem
(74) *Attorney, Agent, or Firm*—Hogan & Hartson LLP (57) ABSTRACT

A light emitting device includes a plurality of chips efficiently disposed in a limited space of an opening that has an approximately elliptical or elongate-circular opening shape. The device includes a lead having a slit formed between a portion for bonding a wire to and a portion for mounting chips on, thereby to prevent extrusion of an adhesive and eliminate defective bonding.

19 Claims, 9 Drawing Sheets

LIGHT EMITTING DEVICE

CROSS-REFERENCE TO RELATED APPLICATIONS

This application is based upon and claims the benefit of priority from the prior Japanese Patent Application No. 2001-110674, filed on Apr. 9, 2001; the entire contents of which are incorporated herein by reference.

BACKGROUND OF THE INVENTION

This invention relates to a light emitting device, in particular, having an excellent emission property and a high reliability.

Light emitting devices combining LEDs (light emitting diodes) or other semiconductor light emitting elements and fluorescent elements have been remarked as inexpensive, long-lived light emitting devices, and are widely used as various kinds of indicators, light sources, flat-type display devices, backlight of liquid crystal displays, and so forth.

As typical light emitting devices, there are those mounting semiconductors light emitting elements in resin stems.

Figure 14A:
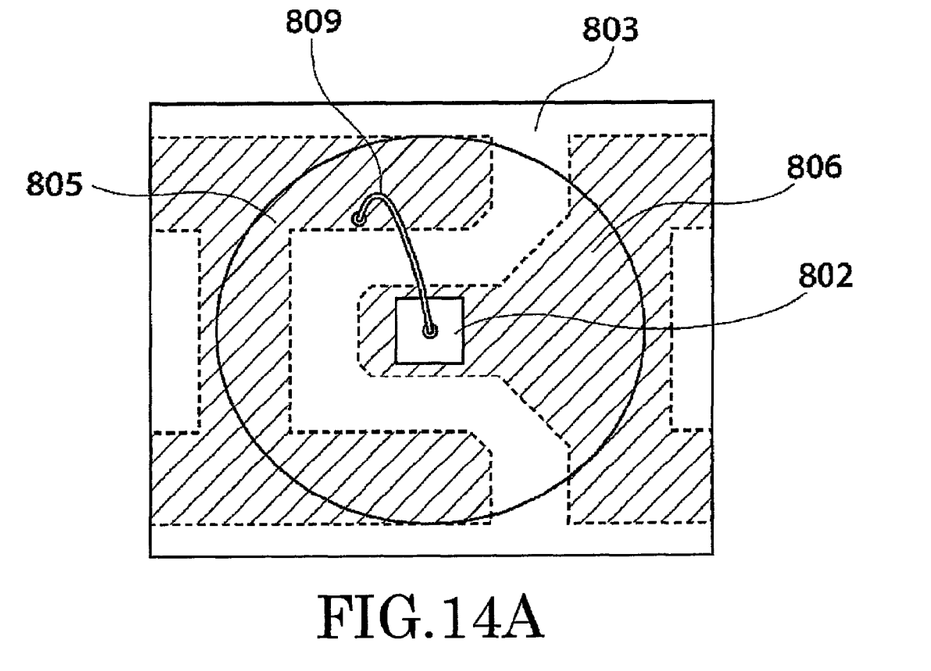
FIG. 14A is a plan view showing a configuration of the substantially part thereof.
Figure 14B:
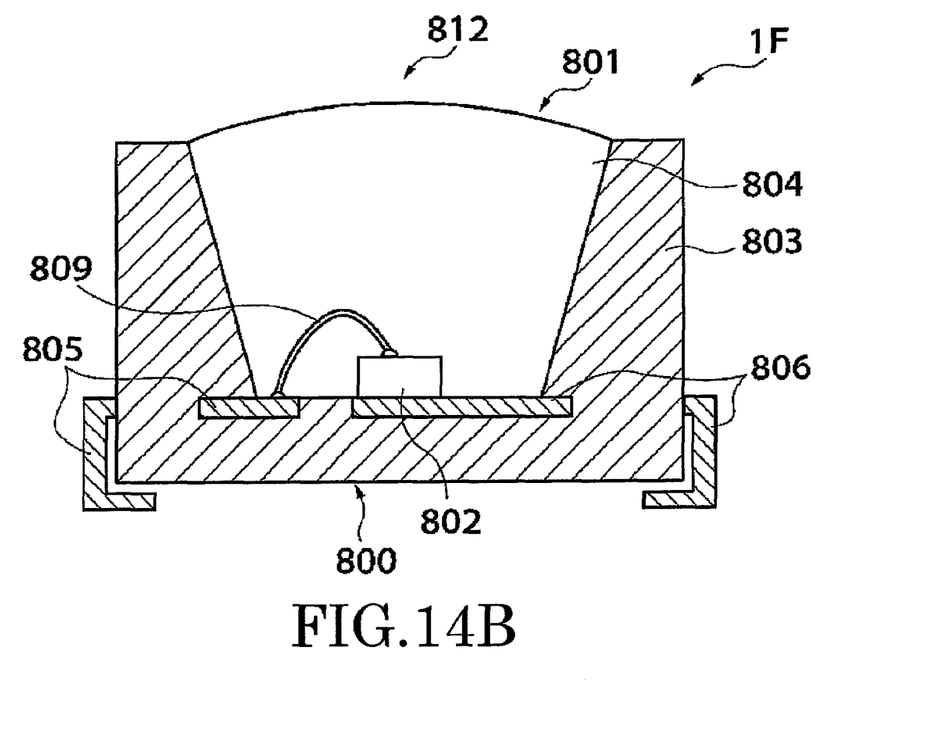
FIG. 14B is a cross-sectional view thereof.

FIGS. 14A and 14B show such a typical conventional light emitting device. FIG. 14A is a plan view showing a configuration of the substantially part thereof, and FIG. 14B is a cross-sectional view thereof.

The light emitting device shown here is of a so-called "surface mounting" type, including a package (resin stem) 800, semiconductor light emitting element 802 and sealing element 804 of a resin.

The resin stem 800 has a structure molding a pair of leads 805, 806 shaped from lead frames with a resin portion 803 of a thermoplastic resin. The resin portion 803 has an opening 801, and the semiconductor light emitting element 802 is place therein. Then the semiconductor light emitting element 802 is sealed with an epoxy resin 804.

The semiconductor light emitting element 802 is mounted on the lead 806. An electrode (not shown) of the semiconductor light emitting element 802 and the lead 805 are connected to each other by a wire 809. When en electric power is supplied to the semiconductor light emitting element 802 through those two leads 805, 806, the semiconductor light emitting element 802 emits light, and the light is extracted from an emission surface 812 via the epoxy resin 804.

It is often required to include two or more chips to be mounted in the opening 801 in the semiconductor devices of a type as shown in FIGS. 14A and 14B.

For example, those having two or more semiconductor elements common in emission wavelength, for example, are enhanced in output.

Those having two or more semiconductor elements different in emission wavelength can provide mixed color, thereby to diversify the color representation. In this case, two complementary colors can produce white light.

It is sometimes desirable to mount an element for protecting the light emitting element in a common package. Incase of a light emitting element of a nitride semiconductor, it is often desirable to connect a Zener diode in a parallel opposite directions for the purpose of protecting the light emitting element from static electricity.

However, the light emitting device shown in FIGS. 14A and 14B cannot provide a sufficient space for mounting the chip and for bonding the wire as well. If two chips are packed in the narrow opening by force, the optical axis of the light emitting element will largely offset from the center of the opening, and the intensity profile of the emitted light, i.e., luminous intensity property, will become asymmetrical. Then, the light emitting device cannot provide a uniform emission pattern required in applications such as the back light of a liquid crystal display.

Figure 15:
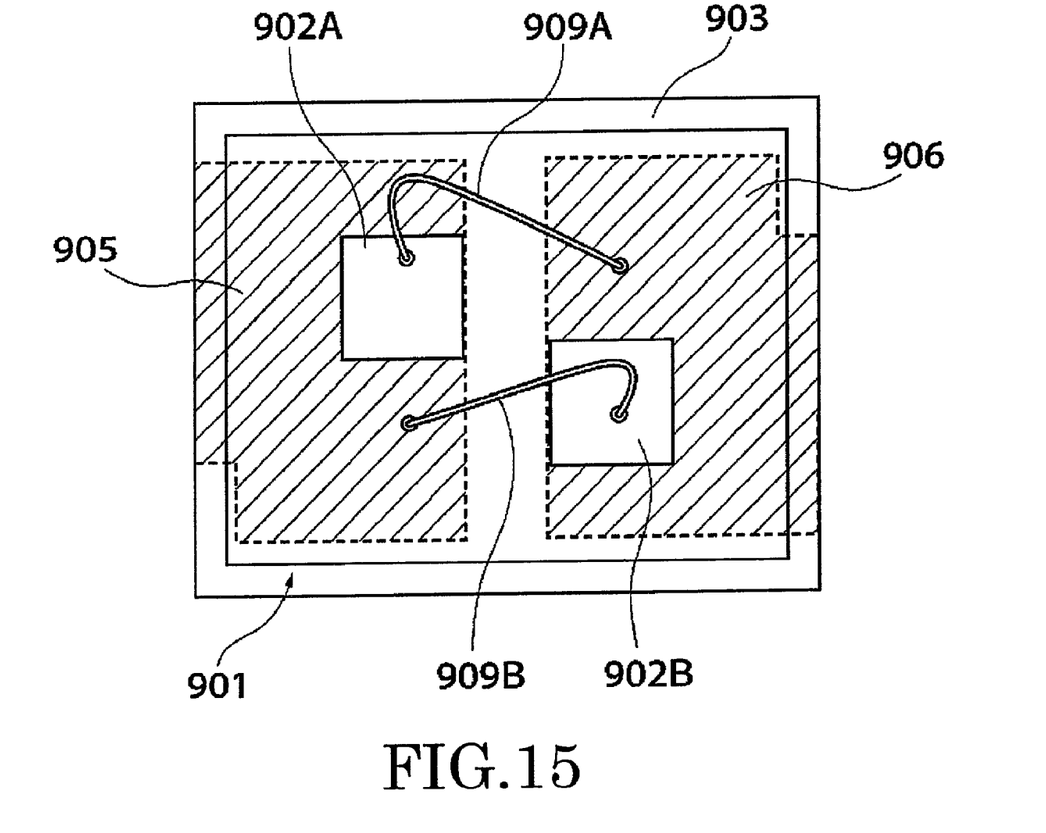
FIG. 15 is a schematic diagram showing a plan-viewed configuration of a light emitting device prepared by the Inventor for trial toward the present invention.

FIG. 15 is a schematic diagram showing a plan-viewed configuration of a light emitting device prepared by the Inventor for trial toward the present invention.

The light emitting device shown here has an approximately rectangular opening 901 formed in a resin portion 903, and chips 902A, 902B mounted on opposed leads 905, 906, respectively, at the bottom of the opening 901. Wires 909A, 909B extending from the chips 902A, 902B are connected to the opposed leads 906, 905, respectively.

As a result of evaluation of this light emitting device, the following problems were found.

The fist problem is that a part of an adhesive extruding out upon mounting the chips 902A, 902B causes insufficient bonding of the wires 909A, 909B. For mounting the chips 902A, 902B to the leads, pastes such as silver paste or solders such as gold-tin (AuSn) or gold-germanium (AuGe) solder is usually used.

However, such an adhesive often extrudes on the leads 905, 906 upon mounting. If the extruded adhesive reaches the wire bonding region, it makes it difficult to bond wires 909A, 909B by thermo compression bonding or ultrasonic welding. For example, when a silver paste exists, so-called "breeding" occurs, and it makes wire bonding difficult. Even if they are once bonded, their bonding force will soon degrade significantly.

An attempt of locating the wire bonding site remote from the chip for the purpose of preventing that problem will need a larger opening 901 against the restriction on size.

The second problem lies in that the illustrated rectangular shape of the opening 901 causes side walls of the resin portion 903 to be uniformly thin, and makes the mechanical strength insufficient. This problem becomes serious especially when a soft resin is used as the sealing element buried in the opening. For example, a silicone resin used as the sealing element is advantageous for reducing the residual stress and thereby reducing cracks of the sealing element and breakage of the wire. However, in case the side wall of the resin portion 903 is thin, the relatively soft silicone resin often fails to prevent an external lateral force to act on the chip and the wire. For example, upon picking up the light emitting device by grasping from its side surfaces for assembly and a test, the force actually acted upon the chip and the wire, and often deformed the wire.

The third problem is that the illustrated rectangular shape of the opening 901 need a larger quantity of resin buried therein, and sometimes increases the resin stress. The resin filled in the opening 901 produces a stress upon curing, or thereafter upon an increase of decrease of the temperature.

The degree of the stress depends on the buried quantity of the resin, and tends to increase as the buried quantity increases.

Therefore, the sealing resin filled in the illustrated rectangular opening 901 produced a large stress, and is liable to cause exfoliation of the chips 902A, 902B, and deformation or breakage of the wires 909A, 909B.

That is, the attempt of mounting two or more chips in the light emitting device invites various problems contravening the requirements about the external dimensions.

As reviewed above, conventional light emitting devices were not suitable for mounting a plurality of chips, and had room for improvement from the viewpoint of reliability as well.

SUMMARY OF THE INVENTION

According to an embodiment of the invention, there is provided a light emitting device comprising: a lead; a resin portion which buries at least a part of said lead; a first semiconductor light emitting element mounted on said lead in an opening formed in said resin portion; a semiconductor element mounted on said lead in said opening; and a wire connecting said first semiconductor light emitting element and said lead, said lead having a slit formed between a portion where said first semiconductor light emitting element is mounted and a portion where said wire is connected.

According to another embodiment of the invention, there is another provided a light emitting device comprising: a first lead; a second lead; a resin portion which buries at least a part of said first and second leads; a first semiconductor light emitting element mounted on said first lead in an opening formed in said resin portion; a semiconductor element mounted on said second lead in said opening; a first wire connecting said first semiconductor light emitting element and said second lead; and a second wire connecting said semiconductor element and said first lead, said first lead having a first slit formed between a portion where said first semiconductor light emitting element is mounted and a portion where said second wire is connected, and said second lead having a second slit formed between a portion where said semiconductor element is mounted and a portion where said first wire is connected.

According to another embodiment of the invention, there is another provided a light emitting device comprising: a first lead; a second lead; a resin portion which buries at least a part of said first and second leads; a first semiconductor light emitting element mounted on said first lead in an opening formed in said resin portion; a semiconductor element mounted on said first lead in said opening; a first wire connecting said first semiconductor light emitting element and said second lead; and a second wire connecting said semiconductor element and said second lead, said opening having a substantially elliptical or elongate-circular opening shape, said first semiconductor light emitting element and said semiconductor element being arranged along a longer axis or a shorter axis of said elliptical or elongate-circular opening.

In the present application, the "elongate-circle" means a shape connecting a pair of curved portions by a pair of substantially straight portions. The curved portions may be either regularly arc-shaped or irregularly arc-shaped.

In the present application, the "fluorescent element" may be any having a wavelength converting function, either inorganic or organic, including inorganic dyes having a wavelength converting function.

In the present application, "nitride semiconductors" include III–V compound semiconductors expressed by the chemical formula $B_x In_y Al_z Ga_{(1-x-y-z)} N$ ($0 \leq x \leq 1$, $0 \leq y \leq 1$, $0 \leq z \leq 1$, $0 \leq x+y+z \leq 1$), where each of x, y, and z is varied throughout its respective range, and further include mixed crystals containing not only N (nitrogen) but also phosphorus (P) and/or arsenic (As) in addition to N as group V elements.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings:

FIGS. 1A and 1B show schematic diagrams illustrating a configuration of the substantial part of a light emitting device according to the first embodiment of the invention, in which

FIGS. 14A and 14B show such a typical conventional light emitting device, where

DETAILED DESCRIPTION OF THE INVENTION

Some embodiments of the invention will now be explained below with reference to the drawings.

First Embodiment

Figure 1A:
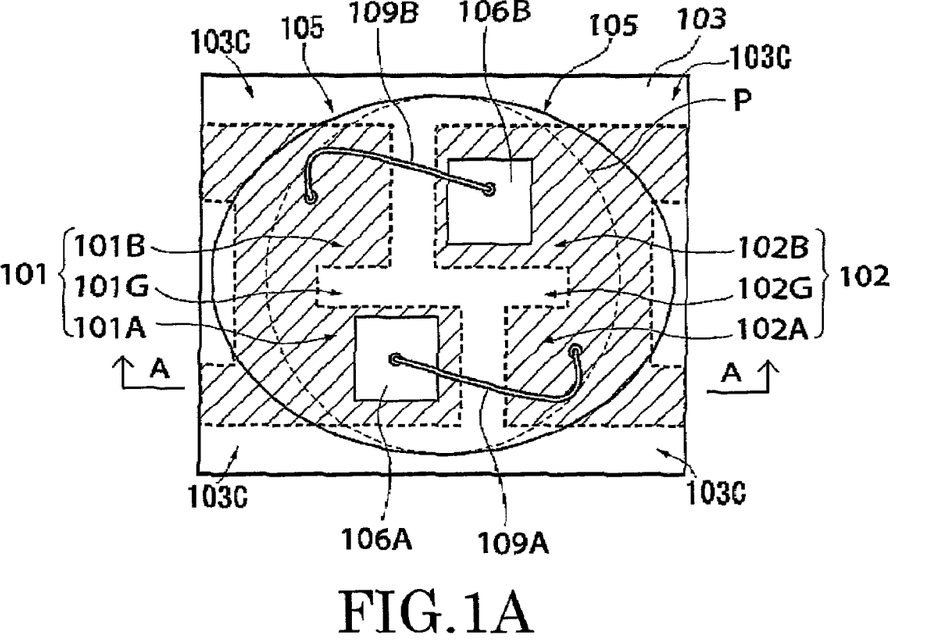
FIG. 1A is a plan view and FIG. 1B is a cross-sectional view taken along the A—A line of FIG. 1A.
Figure 1B:
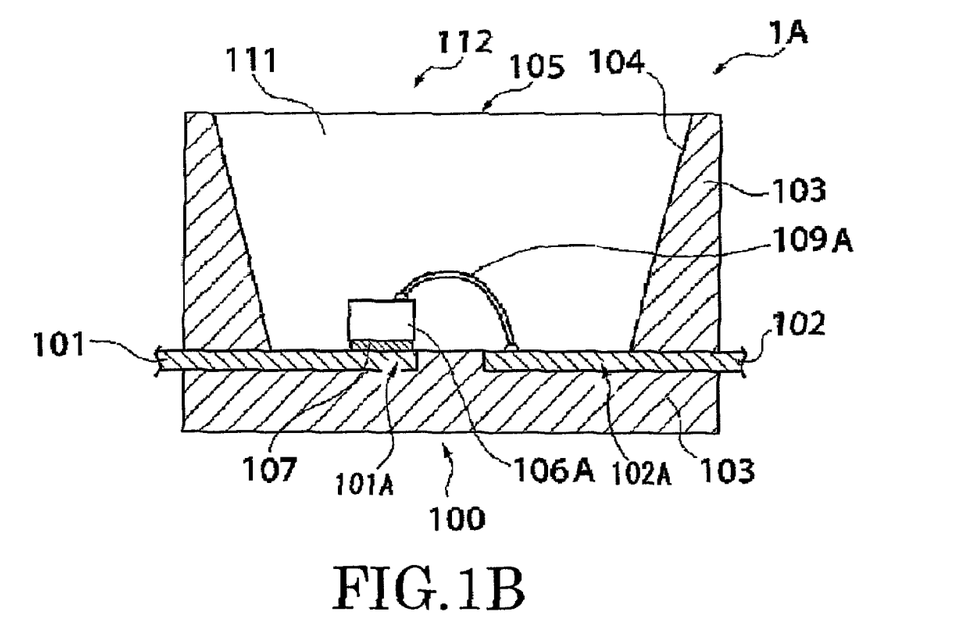

FIGS. 1A and 1B show schematic diagrams illustrating a configuration of the substantial part of a light emitting device according to the first embodiment of the invention, in which FIG. 1A is a plan view and FIG. 1B is across-sectional view taken along the A—A line of FIG. 1A.

The light emitting device 1A shown here includes a resin stem 100, a semiconductor light emitting element 106A mounted on the resin stem 100, a protective Zener diode 106B and a sealing element 111 provided to embed them.

The resin stem 100 includes leads 101, 102 shaped from a lead frame, and a resin portion 103 molded integrally with the leads 101, 102. The leads 101, 102 have opposed ends close to each other, and extend therefrom in the opposite directions to outside the resin portion 103.

The resin portion 103 has formed an opening 105, and the semiconductor light emitting element 106A and the diode 106B are mounted at the bottom of the opening 105. The plan-viewed shape of the opening 105 is approximately elliptical or approximately elongate-circular as illustrated. The inner wall surface of the resin portion 103 surrounding the elements 106A, 106B inclines to face toward the light extraction direction to function as a reflective surface 104 for reflecting light.

In the opening 105, the lead 101 and the lead 102 are isolated. Near the distal end of the lead 101, a slit 101G is formed to divide it into the regions 101A and 101B. Similarly, near the distal end of the lead 102, a slit 102G is formed to divide it into the regions 102A and 102B.

The light emitting element 106A is mounted in the region 101A with an adhesive such as silver (Ag) paste. The light emitting element 106B is mounted in the region 102B similarly with an adhesive 107 such as silver (Ag) paste.

From an electrode (not shown) formed on the light emitting element 106A, the wire 109A is connected to the opposed region 102A. From an electrode (not shown) formed on the diode 106B, the wire 109B is connected to the opposed region 101B.

The configuration explained above provides the following effects.

The slits 101G, 102G formed near distal ends of the leads 101, 102 separate each of them into the portion (101A, 102B) for mounting the chips 106A, 106B and the portion (101B, 102A) for bonding the wires 109A, 109B. This configuration keeps the portion for bonding the wire clean even when silver paste, for example, extrudes upon mounting the chip, and thereby eliminates defective bonding of wires.

Since the invention employs a shape with a longer diameter and a shorter diameter such as an approximately elliptical shape or an approximately elongate-circular shape as the shape of the opening in lieu of an approximately circular shape as shown by a broken line in FIG. 1A, which has been used conventionally, it is possible to effectively increase the area of the opening 105 and thereby make an ample space for mounting two or more chips and bonding the wires.

The approximately elliptical or elongate-circular shape of the opening according to the invention makes it easy to locate the light emitting element closest to the center of the opening.

The use of the approximately elliptical or elongate-circular shape of the opening according to the invention also enables the corner portions 103C to be made thicker. As a result, the light emitting device maintains a sufficient mechanical strength, and it is prevented from deformation or wires and other kinds of damage even upon application of a lateral force during assembly or tests.

Furthermore, the approximately elliptical or elongate-circular shape of the opening prevents an increase of the resin quantity filled inside and thereby prevents the resin stress. As already explained with reference to FIG. 15, the resin stress increases as the quantity of resin filled as the sealing element 111 increases. The invention, however, minimizes the increase of the resin quantity and simultaneously keeps an ample space for locating a plurality of chips. It results in eliminating the problems of exfoliation of chips, deformation or breakage of wires due to an increase of the resin stress. Moreover, the invention enables mounting of a plurality of chips while maintaining the outer dimension of the light emitting device compact. Therefore, by connecting the protective diode 106B in a parallel, opposite direction from the light emitting element 106A as illustrated, the invention can improve the reliability. In addition, by combining light emitting elements different in emission wavelength, the device can realize emission of white and other various colors, which has been difficult to emit conventionally.

The slits 101G, 102G formed in the leads 101, 102 facilitate corners of the lead patterns to be cognized inside the opening in the process of mounting chips or bonding wires. Therefore, the invention ensures more accurate mounting positions of the chips and more accurate bonding positions of the wires than conventional techniques.

Next referring to FIGS. 2 through 8, some modifications will be explained.

Figure 2:
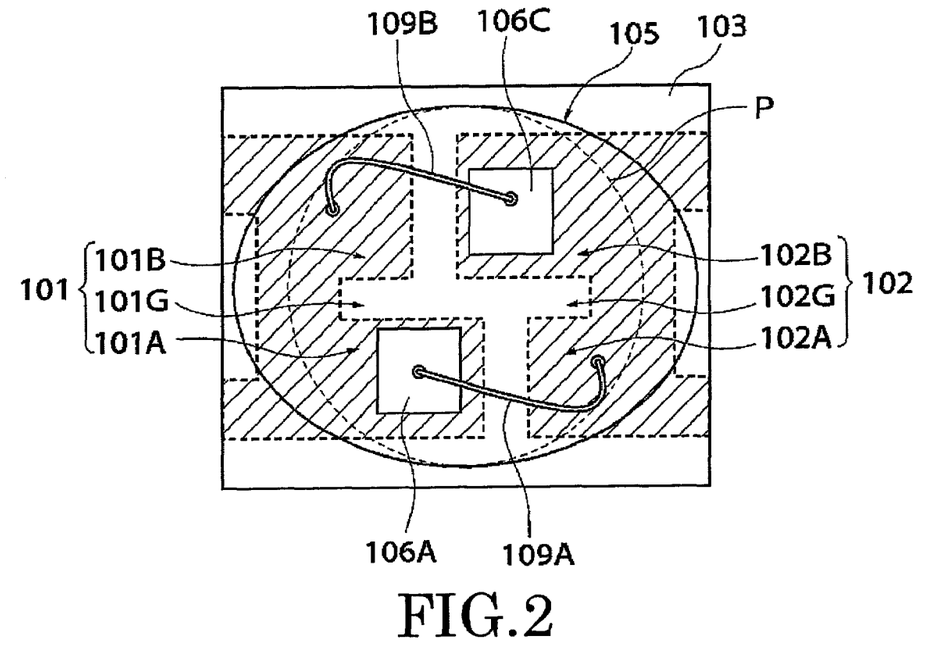
FIG. 2 is a plan view that schematically shows the first modification of the first embodiment.

FIG. 2 is a plan view that schematically shows the first modification of the first embodiment. Here again, the same or equivalent components as those already explained with reference to FIGS. 1A and 1B are commonly labeled, and their detailed explanation is omitted for simplicity.

The light emitting device shown here includes two semiconductor light emitting elements 106, 106C on board. For connecting two elements in parallel by using the layout pattern shown here, elements 106A, 106C reversed in conduction type may be used. That is, one of them may be configured n-side down while the other p-side down.

If two light emitting elements 106A, 106C are equal in emission wavelength, the optical output of the light emitting device can be doubled.

If the light emitting elements are different in emission wavelength, the light emitting device can provide light of a mixed color. In this case, white light can be realized by combining, for example, a blue light emitting element and a yellow light emitting element that are chromatically complementary. White light can be obtained also by combining a red light emitting element and a blue-green light emitting element.

Figure 3:
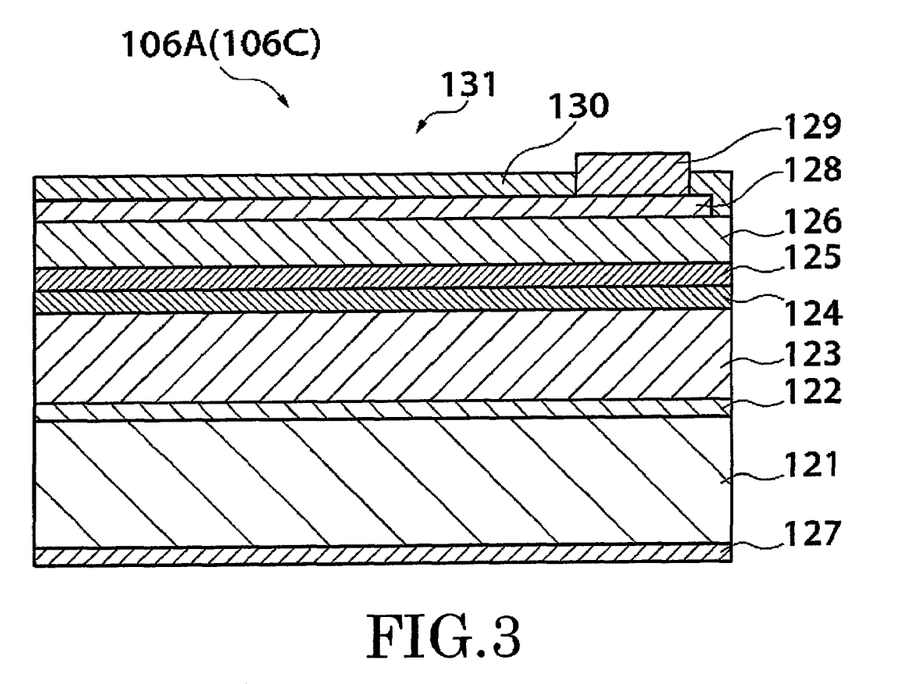
FIG. 3 is a cross-sectional view that schematically shows the structure of a semiconductor light emitting element made of nitride compound semiconductor which can realize a strong emission in a wavelength range between ultraviolet and green.

FIG. 3 is a cross-sectional view that schematically shows a semiconductor light emitting element made with a nitride compound semiconductor which can realize a strong emission in a wavelength range between ultraviolet through green. This structure is briefly explained here. The light emitting element 106A (or 106C) includes a buffer layer 122, n-type contact layer 123, light emitting layer 124, p-type cladding layer 125 and p-type contact layer 126 sequentially stacked on a conductive substrate 121.

The light emitting layer 124 may have a quantum well (QW) structure in which barrier layers and well layers are stacked alternately.

The conductive substrate 121 may be made of, for example, an n-type GaN or SiC. Respective layers on the substrate may be made of, for example, III–V compound semiconductors, II–IV compound semiconductors, IV–VI compound semiconductors and other various materials.

An n-side electrode 127 is provided on the rear surface of the substrate 121. On the other hand, formed on the p-type contact layer 126 are a translucent p-side electrode 128 made of a stacked structure including a nickel (Ni) layer and a gold (Au) layer of a thickness of several ten nanometers, and a bonding pad 129 of gold (Au) connected to the p-side electrode 128. Surface of the element is covered by a protective film 130 of $SiO_2$.

When a voltage is applied to the n-side electrode 127 and the p-side electrode 128 of the light emitting element 106A (106C), light generated in the light emitting layer 124 is released from the surface 131. The emission wavelength can be adjusted in a wide range by adjusting the material and thickness of the light emitting layer.

The embodiment shown here can realize various emission colors by using such semiconductor light emitting elements.

Figure 4:
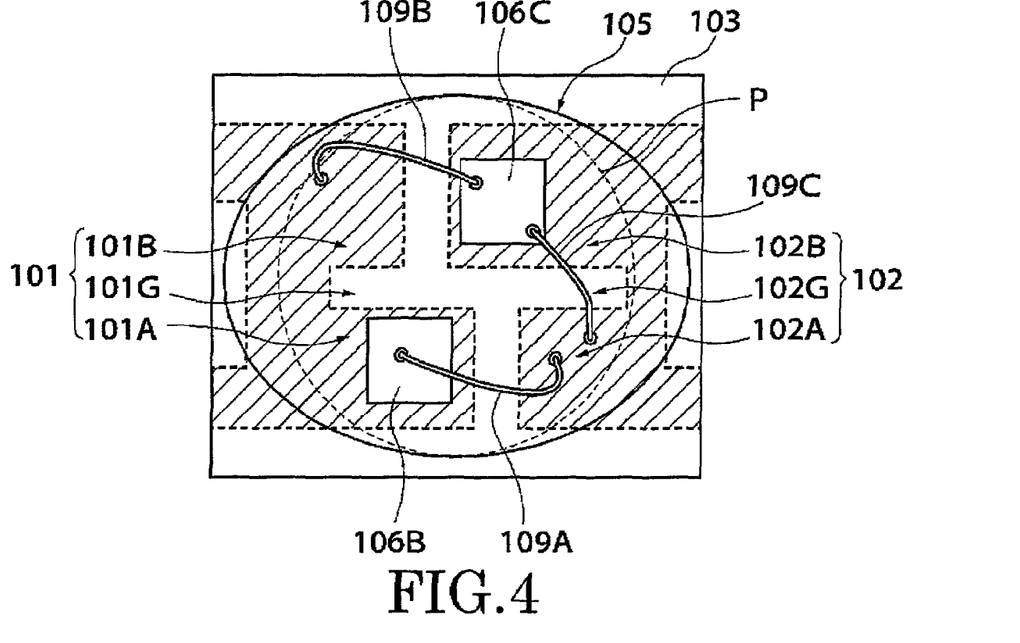
FIG. 4 is a plan view that schematically shows the second specific example of the light emitting device according to the first embodiment.

FIG. 4 is a plan view that schematically shows the second specific example according to the first embodiment. Here again, the same or equivalent components as those already explained with reference to FIGS. 1A through 3 are commonly labeled, and their detailed explanation is omitted for simplicity.

The light emitting device shown here includes a protective diode 106B and a semiconductor light emitting element 106D. The light emitting element 106D is formed on an insulating substrate, and includes p-side and n-side electrodes (not shown) on the front surface. Wires 109B, 109C extending from these electrodes are connected to the leads 101B, 102B, respectively. The protective diode 106B and the light emitting element 106D are connected in the opposite directions in parallel.

Figure 5:
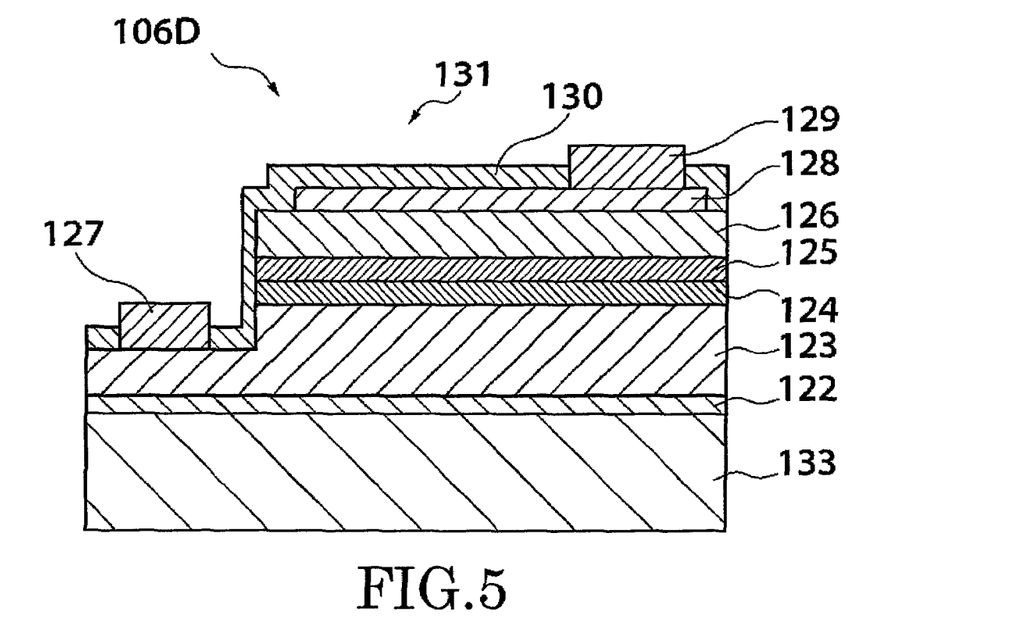
FIG. 5 is a cross-sectional view that shows a structure of the semiconductor light emitting element 106D.

FIG. 5 is a cross-sectional view that shows a structure of the semiconductor light emitting element 106D. The device shown here is made by stacking nitride compound semiconductor layers on an sapphire substrate 133. More specifically, sequentially stacked on the sapphire substrate 133 are a buffer layer 122, n-type contact layer 123, light emitting layer 124, p-type cladding layer 125 and p-type contact layer 126. Here again, the light emitting layer 124 may have a quantum well (QW) structure in which GaN barrier layers and InGaAlN well layers are stacked alternately.

On the n-type contact layer 123 exposed by selectively removing the multi-layered structure from its surface by etching, an n-side electrode 127 made of, for example, Ti/Al is formed. On the other hand, formed on the p-type contact layer 126 are a translucent p-side electrode 128 in form of a Ni/Au thin film having a thickness of tens of nanometers and a bonding pad 129 of gold (Au) connected to the p-side electrode 128. Surface of the element is covered by a protective film 130 of $SiO_2$.

When a voltage is applied to the n-side electrode 127 and the p-side electrode 128 of the light emitting element 106D, intensive emission of light is obtained in the range from ultraviolet rays to green color depending on the composition and structure of the light emitting layer 124.

The specific example shown in FIG. 4 can compactly accommodate both the semiconductor light emitting element 106D formed on the insulating substrate and the protective diode 106B in a limited space, and can reliably, easily bond the predetermined wires 109A through 109C. Moreover, since the chips and the wire bonding portion are isolated by the slits 10G, 102G, defective bonding by extrusion of the adhesive can be eliminated.

Figure 6:
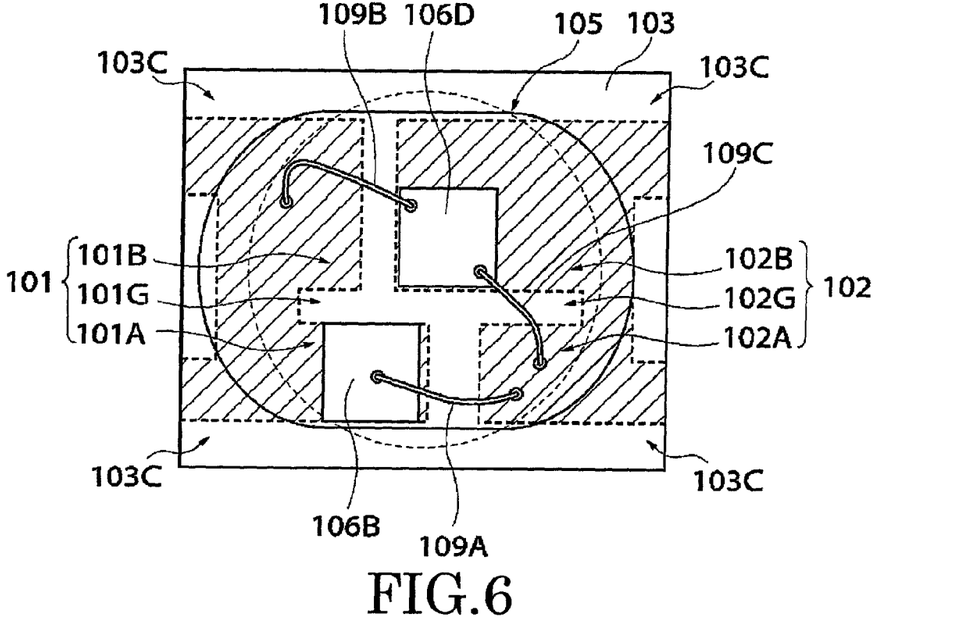
FIG. 6 is a plan view that schematically shows the third modification example of the light emitting device according to the first embodiment.

FIG. 6 is a plan view that schematically shows the third modification example according to the first embodiment. Here again, the same or equivalent components as those already explained with reference to FIGS. 1A through 4 are commonly labeled, and their detailed explanation is omitted for simplicity.

The light emitting device shown here also includes the protective diode 106B and the semiconductor light emitting element 106D. In this specific example, however, the opening 105 is not elliptical but approximately elongate-circular. In the present application, the "elongate circle" means a shape, like that of the opening 105 shown in FIG. 6, having a pair of opposed approximately arc-curved portions and connecting these curved portions by substantially straight portions. The curved portions need not be strictly arc-shaped. That is, the "approximately elongate-circle" pertains to a shape made up of a pair of curved portions connected by two substantially straight portions.

In general, the approximately elongate circle is advantageous for easier processing upon forming the opening 105 in the resin portion 103. In addition, since four corners 103C are thicker, the light emitting device can maintain a sufficient mechanical strength against a lateral stress or impulse.

Furthermore, in the specific example shown here, shapes of the distal ends of the pair of leads 101, 102 are asymmetric. That is, the portion 102B for mounting the light emitting element 106D on is formed to extend forward toward the center of the opening 105. Thus the light emitting element 106D can be located in the center of the opening 105, and the intensity profile of the emitted light, i.e. the luminous intensity property can be approximated to a uniform or symmetric profile. It is also possible to enhance the luminance. "Locating in the center" herein means to locate any portion of the light emitting element 106D on the central axis of the opening 105.

Needless to say, the specific example shown here may use the light emitting element 106A (or 106C) using a conductive substrate instead of the light emitting element 106D.

Figure 7:
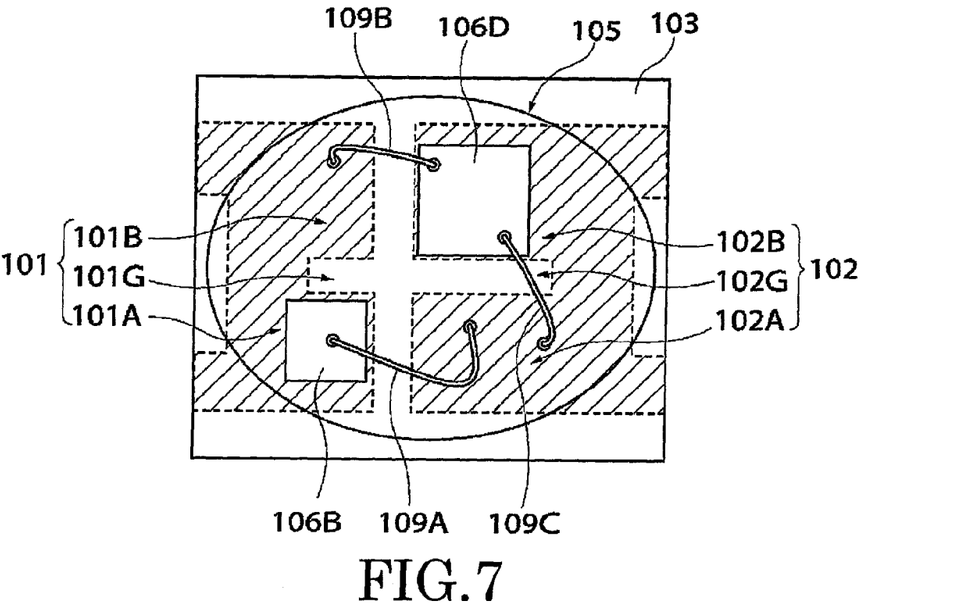
FIG. 7 is a plan view that schematically shows the fourth specific example of the light emitting device according to the first embodiment.

FIG. 7 is a plan view that schematically shows the fourth specific example according to the first embodiment. Here again, the same or equivalent components as those already explained with reference to FIGS. 1A through 6 are commonly labeled, and their detailed explanation is omitted for simplicity.

The light emitting device shown here also includes the protective diode 106B and the semiconductor light emitting element 106D. In this specific example, however, the opposed distal ends of the pair of leads 101, 102 are aligned straight instead of being offset. Then the diode 106B and the light emitting element 106D are mounted at diagonal positions.

The light emitting element 106D is formed to be closer to the center of the opening 105 than the diode 106B. Locating the optical axis closer to the center of the opening 105 ensures a more uniform luminous intensity property.

Figure 8:
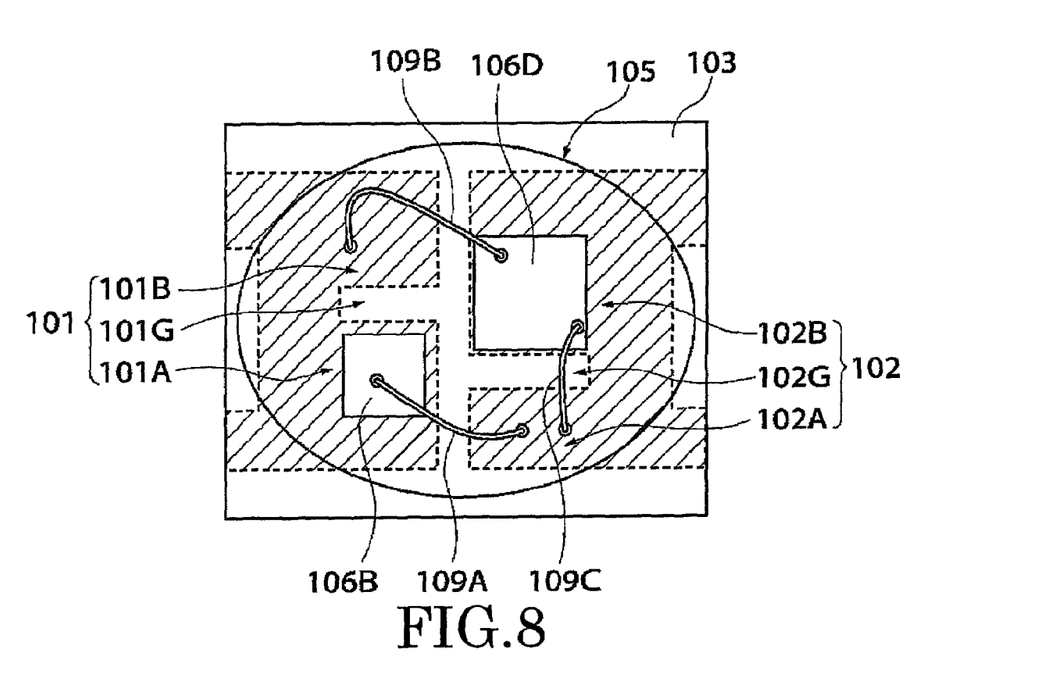
FIG. 8 is a plan view that schematically shows the fifth specific example of the light emitting device according to the first embodiment.

FIG. 8 is a plan view that schematically shows the fifth specific example according to the first embodiment. Here again, the same or equivalent components as those already explained with reference to FIGS. 1A through 7 are commonly labeled, and their detailed explanation is omitted for simplicity.

The light emitting device shown here also includes the protective diode 106B and the semiconductor light emitting element 106D, and the opposed distal ends of the pair of leads 101, 102 are aligned straight instead of being offset. In this specific example, however, the slits 10G, 102G are formed to be offset from each other. This configuration can also locate the light emitting element 106D close to the center of the opening 105.

Second Embodiment

Next explained is a second embodiment of the invention.

Figure 9:
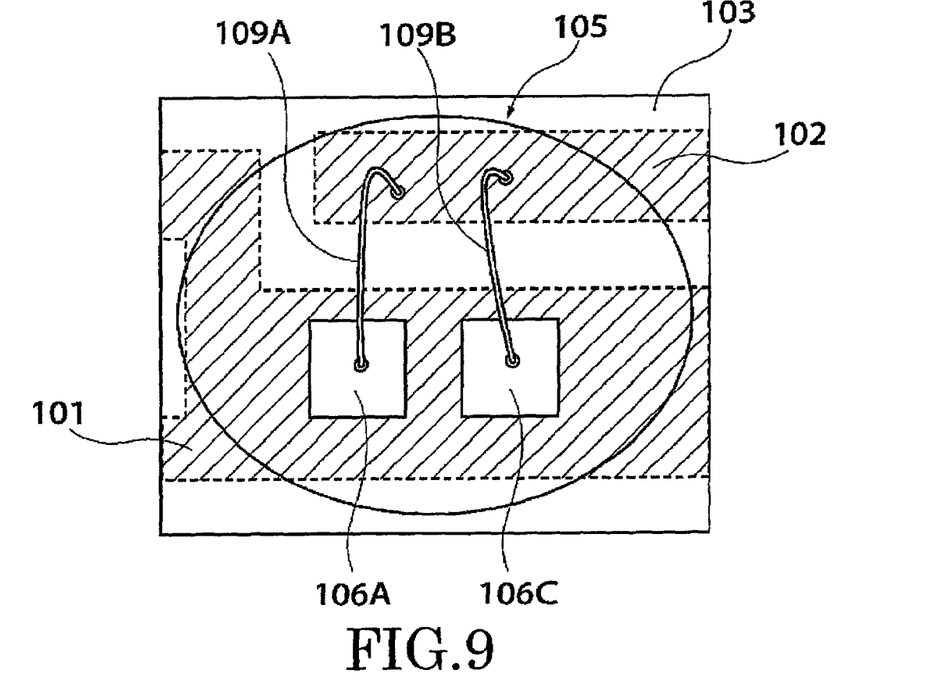
FIG. 9 is a plan view that schematically shows the specific example of the light emitting device according to the second embodiment.

FIG. 9 is a plan view that schematically shows the specific example according to the second embodiment. Here again, the same or equivalent components as those already explained with reference to FIGS. 1A through 8 are commonly labeled, and their detailed explanation is omitted for simplicity.

In this specific example, two chips are mounted on a common lead, and they are aligned along the lengthwise direction of the opening 105 having an approximately elliptical or elongate-circular shape.

That is, in this specific example, the semiconductor light emitting elements 106A, 106C are mounted side by side on the lead 101, and the wires 109A, 109B are connected to the lead 102 in the opposed position with respect to the shorter axis of the opening 105.

This arrangement of a plurality of chips along the longer axis, i.e. lengthwise direction, of the approximately elliptical or elongate-circular opening 105 is advantageous for effective use of the limited space.

Figure 10:
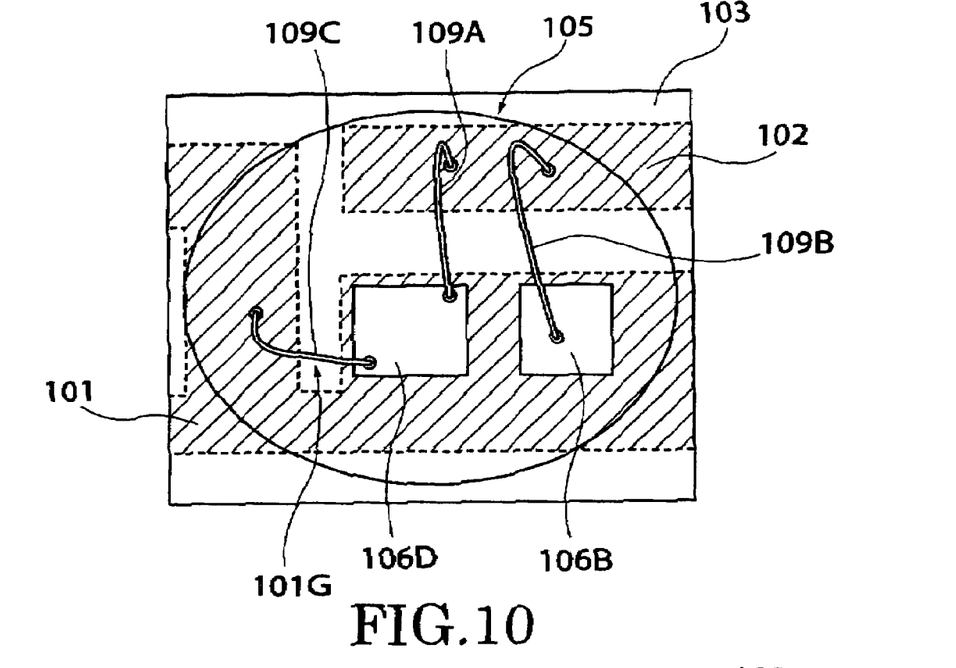
FIG. 10 is a plan view that schematically shows the modification of the second embodiment.

FIG. 10 is a plan view that schematically shows the modification of the second embodiment. Here again, the same or equivalent components as those already explained with reference to FIGS. 1A through 9 are commonly labeled, and their detailed explanation is omitted for simplicity.

In this specific example, it is necessary to connect a second wire 109C from the light emitting element 106D to the lead 101. For this purpose, a slit 101G is formed in the lead 101, and the wire 109C is connected across the slit 101G. In this manner, the bonding region can be isolated from extrusion of the adhesive upon mounting the light emitting element 106D and the diode 106B.

Third Embodiment

Next explained is a third embodiment of the invention.

Figure 11:
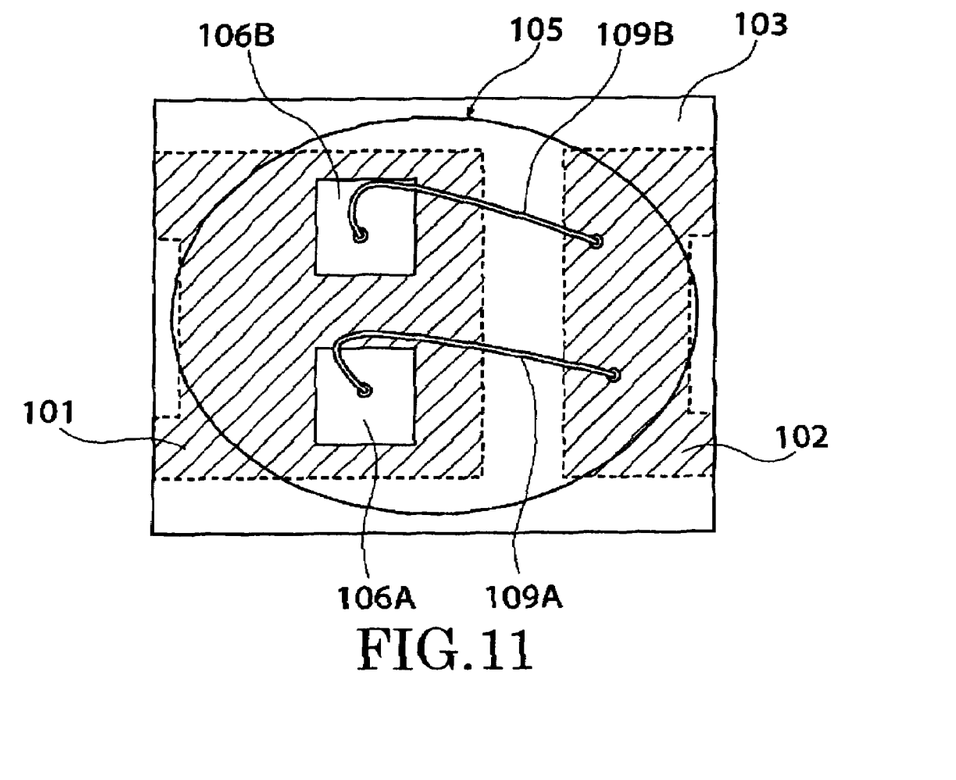
FIG. 11 is a plan view that schematically shows the twelfth specific example of the light emitting device according to the first embodiment.

FIG. 11 is a plan view that schematically shows the twelfth specific example according to the first embodiment. Here again, the same or equivalent components as those already explained with reference to FIGS. 1A through 10 are commonly labeled, and their detailed explanation is omitted for simplicity.

Also in this specific example, two chips are mounted on a common lead. These two chips, however, are disposed along the shorter axis direction of the approximately elliptical or elongate-circular opening 15. Then the wires 109A, 109B are connected to the lead 102 in the opposed position with respect to the shorter axis of the opening 105.

This arrangement of a plurality of chips along the shorter axis of the approximately elliptical or elongate-circular opening 105 is also advantageous for effective use of the limited space.

Figure 12:
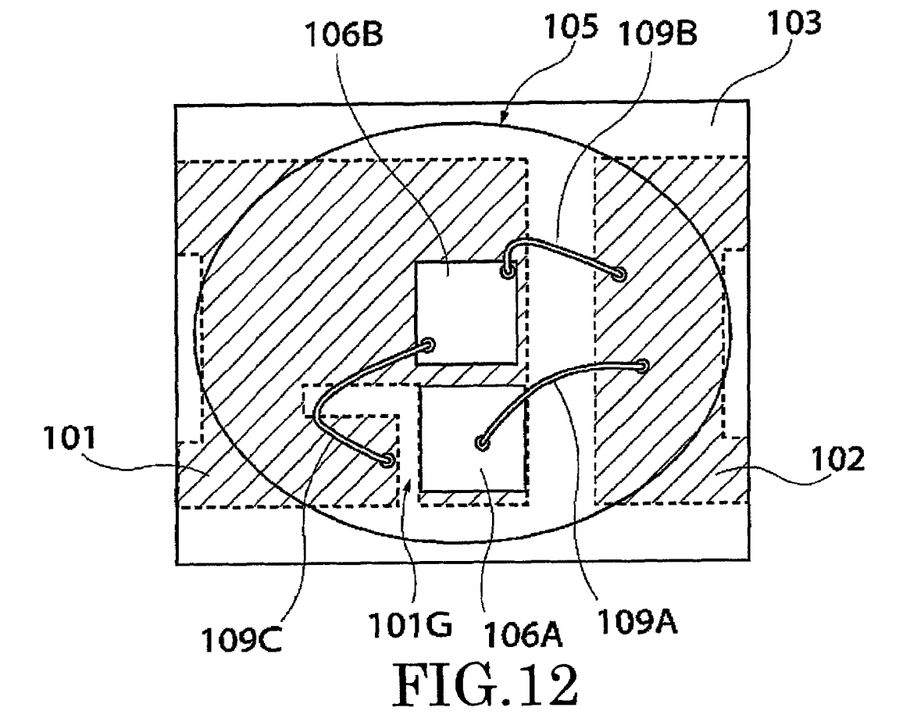
FIG. 12 is a plan view that schematically shows the modification of the third embodiment.

FIG. 12 is a plan view that schematically shows the modification of the third embodiment. Here again, the same or equivalent components as those already explained with reference to FIGS. 1A through 11 are commonly labeled, and their detailed explanation is omitted for simplicity.

In this specific example, it is necessary to connect a second wire 109C from the light emitting element 106D to the lead 101. For this purpose, a slit 101G is formed in the lead 101, and the wire 109C is connected across the slit 101G. In this manner, the bonding region can be isolated from extrusion of the adhesive upon mounting the light emitting element 106D and the diode 106B.

Fourth Embodiment

Next explained is the fourth embodiment of the invention.

Figure 13:
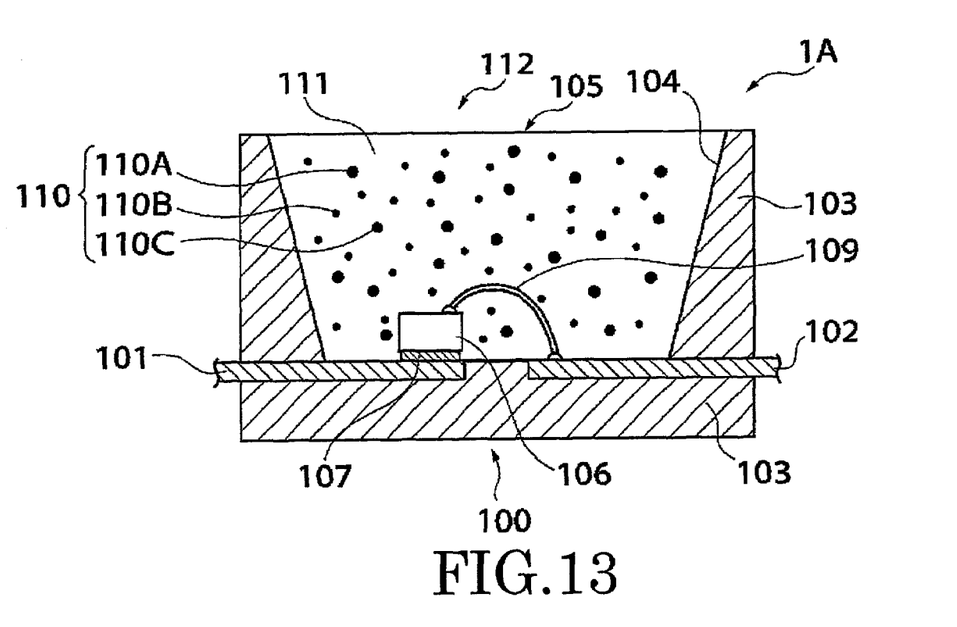
FIG. 13 is a cross-sectional view that schematically shows a configuration of the substantial part of a light emitting device according to the instant embodiment.

FIG. 13 is a cross-sectional view that schematically shows a configuration of the substantial part of a light emitting device according to the instant embodiment. Here again, the same or equivalent components as those already explained with reference to FIGS. 1A through 12 are commonly labeled, and their detailed explanation is omitted for simplicity.

In this embodiment, in a slight emitting device having a plurality of chips as shown in FIGS. 1A through 12, light emitted from the light emitting element 106 is extracted after wavelength conversion by the fluorescent element.

Regarding the specific example shown in FIG. 13, the light emitting element 106 is connected in parallel with a protective diode, not shown. The layout pattern of these chips and the leads 101, 102 may be any of those explained with reference to FIGS. 1A through 12.

The opening 105 in form of an approximate ellipse or flattened circle formed in the resin portion 103 is buried by the sealing element 111 containing the fluorescent element 110. The sealing element 111, however, may be provided to bury a part of the opening 105 in lieu of the manner shown here.

The fluorescent element 110 contained in the sealing element 111 absorbs primary light emitted from the light emitting element 106 and releases light of a predetermined wavelength.

For example, the light emitting element 106 may be configured to emit ultraviolet rays, i.e. light having a peak wavelength shorter than 400 nm, and may be combined with a fluorescent element that absorbs this short wavelength light and releases light of a predetermined wavelength. Especially when a first fluorescent element 110A absorbing the primary light to emit red light, a second fluorescent element 110B absorbing the primary light to emit green light, and a third fluorescent element 110C absorbing the primary light to emit blue light, white light can be obtained as their mixture.

In case the light emitting element 106 is configured to emit light of a short wavelength such as ultraviolet rays, the sealing element 111 is preferably made of a silicone resin instead of an epoxy resin used in the conventional devices. Epoxy resins deteriorate when exposed to short-wavelength light, and although originally transparent, they change in color through yellow, liver to black finally, and result in a serious decrease of the light extraction efficiency. Silicone resins are substantially free from such deterioration.

The present application contemplates, with the term "silicone resin", any resin having as its skeleton a structure in which silicon atoms having organic radicals such as alkyl radicals or aryl radicals are alternately connected to oxygen atoms. Needless to say, those containing additive elements added to such skeletons are also included in "silicone resins".

In order to excite the fluorescent element, a light source of a short wavelength is preferably used. On of such examples is the light source using nitride semiconductor as explained with reference to FIG. 3 and FIG. 5. If, however, a light emitting element using a nitride semiconductor is used, a diode (like a Zener diode) protective against static electricity is preferably combined. In this case, it is necessary to accommodate these two chips in a limited space and reliably connect them by wire bonding.

The invention can reliably cope with this requirement. As already explained with reference to the first to third embodiments, the invention makes it possible to efficiently place a plurality of chips and well isolate the wire bonding region, thereby to eliminate defective bonding. As a result, the invention can realize a high-performance light emitting device combining the semiconductor light emitting element 106 using a nitride semiconductor with the fluorescent element 110 as shown in FIG. 13.

Heretofore, some embodiments have been explained by way of specific examples. The invention, however, is not limited to those specific examples.

For example, combination of chips mounted on the light emitting device is not limited to that illustrated, but combination of a light emitting element 106A (or 106C) and a diode 106B, combination of two or more light emitting elements 106A (or 106C), and combination of a light emitting element 106A (or 106C) and a light emitting element 106D are also acceptable.

The number of chips mounted in the opening is not limited to two, but three or more chips can be mounted as well.

The shape of the opening 105 may be either approximately elliptical or flattened-circular.

Regarding the shapes and relative dimensions of the leads, any changes adequately determined individually are also contemplated in the scope of the invention.

The light emitting elements 106A, 106C, 106D used in the invention are not limited to those using a nitride semiconductor, but those using GaAs/AlGaAs compounds, InP/InGaAs compounds, InGaAlP compounds, ZeSe compounds, ZnS compounds and other various materials can be similarly used as well. This is the case also for the diode 106B.

Regarding the material of the fluorescent element, concrete structure of the light emitting elements, shapes of the leads and sealing element 111, relative dimensions of the respective components, and so on, design changes made by the ordinary person skilled in the art are also contemplated in the scope of the invention.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A light emitting device comprising:
a lead;
a resin portion which buries at least a part of said lead;
a first semiconductor light emitting element mounted on said lead in an opening formed in said resin portion;
a semiconductor element mounted on said lead in said opening; and
a wire connecting said first semiconductor light emitting element and said lead;
said lead having a slit formed between a first portion where said first semiconductor light emitting element is mounted and a second portion where said wire is connected, and
said lead further having a third portion which connects said first and second portions and said semiconductor element is a second semiconductor light emitting element.

2. A light emitting device according to claim 1 wherein said first semiconductor light emitting element and said second semiconductor light emitting element are different in peak wavelength of light they emit.

3. A light emitting device comprising:
a lead;
a resin portion which buries at least a part of said lead;
a first semiconductor light emitting element mounted on said lead in an opening formed in said resin portion;
a semiconductor element mounted on said lead in said opening; and
a wire connecting said first semiconductor light emitting element and said lead;
said lead having a slit formed between a first portion where said first semiconductor light emitting element is mounted and a second portion where said wire is connected, and
said lead further having a third portion which connects said first and second portions, said first semiconductor light emitting element includes a light emitting layer made of a nitride semiconductor, and said semiconductor element is a protective diode.

4. A light emitting device comprising:
a lead;
a resin portion which buries at least a part of said lead;
a first semiconductor light emitting element mounted on said lead in an opening formed in said resin portion;
a semiconductor element mounted on said lead in said opening;
a wire connecting said first semiconductor light emitting element and said lead; and
a fluorescent element which absorbs light emitted from said first semiconductor light emitting element and releases light of a peak wavelength different from said light from said first semiconductor light emitting element,
said lead having a slit formed between a first portion where said first semiconductor light emitting element is mounted and a second portion where said wire is connected, and
said lead further having a third portion which connects said first and second portions.

5. A light emitting device according to claim 4 further comprising a sealing element buried in said opening,
said fluorescent element being mixed in said sealing element.

6. A light emitting device comprising:
a first lead;
a second lead;
a resin portion which buries at least a part of said first and second leads;
a first semiconductor light emitting element mounted on said first lead in an opening formed in said resin portion;
a semiconductor element mounted on said second lead in said opening;
a first wire connecting said first semiconductor light emitting element and said second lead; and
a second wire connecting said semiconductor element and said first lead;
said first lead having a first slit formed between a first portion where said first semiconductor light emitting element is mounted and a second portion where said second wire is connected,
said first lead further having a third portion which connects said first and second portions,
said second lead having a second slit formed between a fourth portion where said first semiconductor light emitting element is mounted and a fifth portion where said second wire is connected, and
said second lead further having a sixth portion which connects said fourth and fifth portions.

7. A light emitting device according to claim 6 wherein said first semiconductor light emitting element is placed in the center of said opening.

8. A light emitting device according to claim 6 wherein the opening shape of said opening is substantially elliptical or elongate-circular.

9. A light emitting device according to claim 6 wherein said semiconductor element is a second semiconductor light emitting element.

10. A light emitting device according to claim 9 wherein said first semiconductor light emitting element and said second semiconductor light emitting element are different in peak wavelength of light they emit.

11. A light emitting device according to claim 6 wherein said first semiconductor light emitting element includes a light emitting layer made of a nitride semiconductor, said semiconductor element being a protective diode.

12. A light emitting device according to claim 6 further comprising a fluorescent element which absorbs light emitted from said first semiconductor light emitting element and releases light of a peak wavelength different from said light from said first semiconductor light emitting element.

13. A light emitting device according to claim 12 further comprising a sealing element buried in said opening, said fluorescent element being mixed in said sealing element.

14. A light emitting device comprising:

a first lead;

a second lead;

a resin portion which buries at least a part of said first and second leads;

a first semiconductor light emitting element mounted on said first lead in an opening formed in said resin portion;

a semiconductor element mounted on said first lead in said opening;

a first wire connecting said first semiconductor light emitting element and said second lead;

a second wire connecting said semiconductor element and said second lead; and a third wire connecting said first semiconductor light emitting element and said first lead, said opening having a substantially elliptical or elongate-circular opening shape, said first semiconductor light emitting element and said semiconductor element being arranged along a longer axis or a shorter axis of said elliptical or elongate-circular opening, said first lead having a slit formed between a first portion where said first semiconductor light emitting element is mounted and a second portion where said third wire is connected, and said first lead further having a third portion which connects said first and second portions.

15. A light emitting device according to claim 14 wherein said semiconductor element is a second semiconductor light emitting element.

16. A light emitting device according to claim 15 wherein said first semiconductor light emitting element and said second semiconductor light emitting element are different in peak wavelength of light they emit.

17. A light emitting device according to claim 16 wherein said first semiconductor light emitting element includes a light emitting layer made of a nitride semiconductor, said semiconductor element being a protective diode.

18. A light emitting device according to claim 16 further comprising a fluorescent element which absorbs light emitted from said first semiconductor light emitting element and releases light of a peak wavelength different from said light from said first semiconductor light emitting element.

19. A light emitting device according to claim 18 further comprising a sealing element buried in said opening, said fluorescent element being mixed in said sealing element.

* * * * *